United States Patent
Ravi

Patent Number: 5,807,785
Date of Patent: Sep. 15, 1998

[54] LOW DIELECTRIC CONSTANT SILICON DIOXIDE SANDWICH LAYER

[75] Inventor: Tirunelveli S. Ravi, Santa Clara, Calif.

[73] Assignee: Applied Materials, Inc., Santa Clara, Calif.

[21] Appl. No.: 691,990

[22] Filed: Aug. 2, 1996

[51] Int. Cl.$^6$ ................................. H01L 21/316
[52] U.S. Cl. ........................... 438/624; 438/784
[58] Field of Search ..................... 437/240, 238; 438/783, 784, 624, 789; 427/579

[56] References Cited

U.S. PATENT DOCUMENTS

| | | | |
|---|---|---|---|
| 4,300,989 | 11/1981 | Chang | 204/164 |
| 4,717,586 | 1/1988 | Ishihara et al. | 427/39 |
| 4,818,563 | 4/1989 | Ishihara et al. | 427/55 |
| 4,851,370 | 7/1989 | Doklan et al. | 437/225 |
| 4,872,947 | 10/1989 | Wang et al. | 437/238 |
| 4,894,352 | 1/1990 | Lane et al. | 437/238 |
| 5,000,113 | 3/1991 | Wang et al. | 118/723 |
| 5,013,691 | 5/1991 | Lory et al. | 437/238 |
| 5,156,881 | 10/1992 | Okano et al. | 427/572 |
| 5,215,787 | 6/1993 | Homma | 427/248.1 |
| 5,275,977 | 1/1994 | Otsubo et al. | 437/235 |
| 5,288,518 | 2/1994 | Homma | 427/255 |
| 5,314,724 | 5/1994 | Tsukune et al. | 427/489 |
| 5,319,247 | 6/1994 | Matsuura | 257/760 |
| 5,334,552 | 8/1994 | Homma | 437/195 |
| 5,344,797 | 9/1994 | Pai et al. | 437/238 |
| 5,385,763 | 1/1995 | Okano et al. | 427/572 |
| 5,399,529 | 3/1995 | Homma | 437/195 |
| 5,403,630 | 4/1995 | Matsui et al. | 427/583 |
| 5,407,529 | 4/1995 | Homma | 156/643 |

(List continued on next page.)

FOREIGN PATENT DOCUMENTS

| | | | | |
|---|---|---|---|---|
| 6 1276-977-A | 12/1986 | Japan | | C23C 16/50 |
| 4-239750 | 8/1992 | Japan | | H01L 21/90 |
| 4-341568 | 11/1992 | Japan | | C23C 16/40 |
| WO 92/20833 | 11/1992 | WIPO | | C23C 16/00 |

OTHER PUBLICATIONS

Shapiro, M.J, et al. "Dual Frequency Plasma CVD Fluorosilicate Glass Water Absorption and Stability", Dumil Conf., Feb. 21–22, 1995, pp. 118–123.

Laxman, Ravi "Low $\epsilon$ Dielectrics: CVD Fluorinated Silicon Dioxides" Semiconductor International, May 1995 pp. 71, 72, 74.

Carl, D., et al. "The Effect of $O_2:C_2F_6$ Ratios and Low Frequency Power on the Cap Fill Properties and Stability of F–TEOS Films", Dumic Conf., Feb. 21–22, 1995 pp. 234–240.

Matsuda et al., "Dual Frequency Plasma CVD Fluorosilicate Glass Deposition For 0.25 $\mu$m Interlevel Dielectrics", Dumic Conference, Feb. 1995, pp. 22–28.

Takeishi et al., "Stabilizing Dielectric Constants Of Fluorine–Doped–SiO2 Films By N20–Plasma Annealing", Dumic Conference, Feb. 1995, pp. 257–259.

Musaka et al., "Single Step Gap Filling Technology For Subhalf Micron Metal Spacings On Plasma Enhanced TEOS/$O_2$ Chemical Vapor Deposition System", Extended Abstracts of the 1993 International Conference on Solid State Devices and Materials, Makuhari, 1993, pp. 510–512.

(List continued on next page.)

Primary Examiner—Charles L. Bowers, Jr.
Assistant Examiner—Matthew Whipple
Attorney, Agent, or Firm—Townsend & Townsend & Crew LLP

[57] ABSTRACT

An improved sandwich layer of silicon dioxide layers for gap filling between metal lines. This is accomplished using a first layer formed in a PECVD process using TEOS and a fluorine-containing compound to give a barrier layer with a dielectric constant of less than 4.0, preferably approximately 3.5. Subsequently, an SACVD process is used with TEOS to form a gap filling layer. By appropriately choosing the thickness of the respective layers, one can adjust the dielectric to a value which is a combination of the dielectric constants of the two different layers, preferably giving a dielectric constant of approximately 3.6–3.7.

8 Claims, 4 Drawing Sheets

U.S. PATENT DOCUMENTS

| | | | |
|---|---|---|---|
| 5,413,967 | 5/1995 | Matsuda et al. | 437/235 |
| 5,420,075 | 5/1995 | Homma et al. | 437/195 |
| 5,429,995 | 7/1995 | Nishiyama et al. | 437/238 |
| 5,489,553 | 2/1996 | Chen | 437/238 |

OTHER PUBLICATIONS

Fukada et al., "Preparation of SiOF Films with Low Dielectric Constant By ECR Plasma CVD", Dumic Conference, Feb. 1995, pp. 43–49.

Qian et al., "High Density Plasma Deposition And Deep Submicron Gap Fill With Low Dielectric Constant SIOF Films", Dumic Conference, Feb. 1995, pp. 50–56.

Hayasaka et al., "High–Quality And Low Dielectric constant $SiO_2$ CVD Using High Density Plasma", Dry Process Symposium, Nov. 1994, pp. 163–168.

Yu et al., "Step Coverage Study of Peteos Deposition for Intermetal Dielectric Applications", VMIC Conference, Jun. 1990, pp. 166–172.

Webb et al., "Silicon Dioxide Films Produced By PECVD Of TEOS and TMCTS", Proceedings of the Int. Symp. on Ultra Large Scale Integration Science and Technology, No. 9, 1989, pp. 571–585.

Hoff et al., "Thermal Oxidation Of Silicon In An Afterglow Gas", (undated), Ctr. for Elect. Materials and Devices, Penn State Univ.

Chang et al., "Frequency Effects and Properties of Plasma Deposited Fluorinated Silicon Nitride", J. Vac. Sci. Technol. B6 (2) 1988, pp. 524–532.

LOW DIELECTRIC CONSTANT SILICON DIOXIDE SANDWICH LAYER

BACKGROUND OF THE INVENTION

The present invention relates to sandwich silicon dioxide layers for filling gaps in metal layers on a semiconductor substrate.

One of the primary steps in the fabrication of modern semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having metal layers.

One particular thermal CVD process that has been developed to deposit insulation films over metal layers at relatively low, nondamaging temperatures includes deposition of a silicon oxide layer from tetraethylorthosilicate (TEOS) and ozone ($O_3$) precursor gases. Such a TEOS/ozone silicon oxide film may be deposited under carefully controlled pressure conditions in the range of about 20–700 torr, and is therefore commonly referred to as a subatmospheric CVD (SACVD) film. The high reactivity of TEOS with ozone reduces the external energy required for a chemical reaction to take place, and thus lowers the required temperature for such SACVD processes.

Other CVD methods of depositing silicon oxide layers over metal layers at relatively low temperatures include plasma-enhanced CVD (PECVD) techniques. Plasma-enhanced CVD techniques promote excitation and/or disassociation of the reactant gases by the application of radio frequency (RF) energy to a reaction zone near the substrate surface, thereby creating a plasma of highly reactive ionic species. The high reactivity of the released ionic species reduces the energy required for a chemical reaction to take place, and thus lowers the required temperature for such PECVD processes.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's wafer fabrication plants are routinely producing devices having 0.5 and even 0.35 $\mu$m feature sizes, and tomorrow's plants soon will be producing devices having even smaller geometries.

As device sizes become smaller and integration density increases, one issue that has become increasingly important is the capability of a deposited insulating layer to fill closely spaced gaps (referred to as a film's "gap fill" capability), such as those between adjacent metal lines. One process that has been used successfully to fill gaps with an aspect ratio of up to 2:1 or higher is the deposition of a two-layer ("sandwich" layer) silicon oxide dielectric film using both PECVD and SACVD processes. In one such film, a first layer of thin PECVD silicon oxide (the PECVD lining layer) is deposited over the stepped topography of a substrate (e.g., closely spaced metal lines) from a plasma of TEOS and oxygen. A second silicon oxide layer (the SACVD layer), formed by an SACVD process using TEOS and ozone (4–8% weight percent ozone in oxygen) precursor gases, is then deposited on top of the lining layer. The PECVD lining layer functions as an initial lining layer and diffusion barrier for the overlying SACVD layer; it fills in part of the gap between the metal lines and improves the uniformity and rate of deposition of the SACVD layer.

One method of creating the two layers is to deposit the first layer in one chamber and then move the wafer to a second reactor chamber for depositing the SACVD film. A second, preferred method uses a chamber which has the capability for both SACVD (20–700 torr) and PECVD (0.5–20 torr) processes, so that the entire deposition sequence is an in situ process. Such an in situ process is described in detail in U.S. Pat. No. 5,000,113 entitled "Thermal CVD/PECVD Reactor and Use for Thermal Chemical Vapor Deposition of Silicon Dioxide and In situ Multi-step Planarized Process," issued to Wang et al. and assigned to Applied Materials, Inc., the assignee of the present invention, which is incorporated herein by reference for all purposes.

A cross section of a prior art semiconductor structure having aluminum lines 50 separated by a gap 52 filled in by this technique is shown in FIG. 2. As shown in FIG. 2, gap 52 is first filled with a layer 54 of undoped silicon oxide formed using a PECVD process with TEOS. This produces a barrier layer which is compressive and can be deposited directly on the metal. Subsequently, a second undoped silicon oxide layer 56 is deposited using an SACVD process with ozone and TEOS to fill the remaining portion of gap 52. The SACVD deposition process provides good gap filling capabilities for layer 56. Because the SACVD layer has a relatively slow deposition rate, it is sometimes desirable to deposit a third undoped silicon oxide PECVD layer on top of the first two layers. This PECVD layer (shown as layer 58) can be deposited more quickly, reducing the time required to deposit a layer of desired thickness. If appropriate, the third layer can then be planarized using a chemical mechanical polish (CMP) or other technique.

In another process, TEOS in combination with a halogen-containing gas and an oxygen gas is used as a technique for filling gaps in submicron architectures, as disclosed in co-pending U.S. patent application Ser. No. 08/184,331, entitled "A Method of Forming a Thin Film for a Semiconductor Device" and assigned to Applied Materials, Inc. In order to provide an insulating layer which has appropriate compressive stress, one technique deposits a film by employing a first PECVD process using TEOS and a halogen-containing gas, such as a fluorine-containing gas, followed by a second PECVD process with a TEOS gas and no halogen-containing gas. This technique is disclosed in commonly assigned, co-pending U.S. patent application Ser. No. 08/259,608, entitled "Composite Layer of Silicon Oxide Formed Over a Semiconductor Substrate and Characterized by Substantial Absence of Voids, High Compressive Stress, Low Dielectric Constant, and Low Hygroscopicity, and Method of Making Same."

In submicron architectures, with an aspect ratio of 2:1 or more, the capacitance across gap 52, shown in FIG. 2, becomes critical. In the process described in FIG. 2, the dielectric constant of layer 54 would typically be about 4.0, while that of layer 56 would be about 4.1. For processes with a gap of less than 0.35 micrometer, it would be desirable to have a lower dielectric constant for the gap-filling silicon dioxide while retaining the other advantages of a sandwich layer as shown in FIG. 2.

SUMMARY OF THE INVENTION

The present invention provides an improved sandwich layer of silicon oxide layers for gap filling between metal or other conducting lines. This is accomplished using a first layer formed in a PECVD process using TEOS and a fluorine-containing compound to create a barrier layer with a dielectric constant of less than 4.0, preferably approximately 3.5. Subsequently, an SACVD process is used with TEOS to form a gap filling layer. Appropriate choice of thickness for the respective layers allows the dielectric constant to be adjusted to a value which is a combination of the dielectric constants of the two different layers, preferably resulting in a dielectric constant of approximately 3.6 to 3.7.

In a preferred embodiment, the fluorine compounds used are $SiF_4$ or $C_2F_6$. This initial layer is a fluoro silicate glass (FSG) layer, with a second layer preferably being an undoped silicate glass (USG) layer. For gap spacing of 0.30 micrometer, preferably, the two sidewalls are covered with the first FSG layer to a thickness of 700 Å each, or a total of 1400 Å. The SACVD USG layer then fills in the remaining gap of approximately 1600 Å, with the resulting dielectric constant being approximately 3.7.

For a fuller understanding of the nature and advantages of the invention, reference should be made to the following description taken in conjunction with the accompanying drawings.

DETAILED DESCRIPTION OF THE PREFERRED EMBODIMENTS

I. Exemplary CVD Reactor Chamber

Figure 1A:
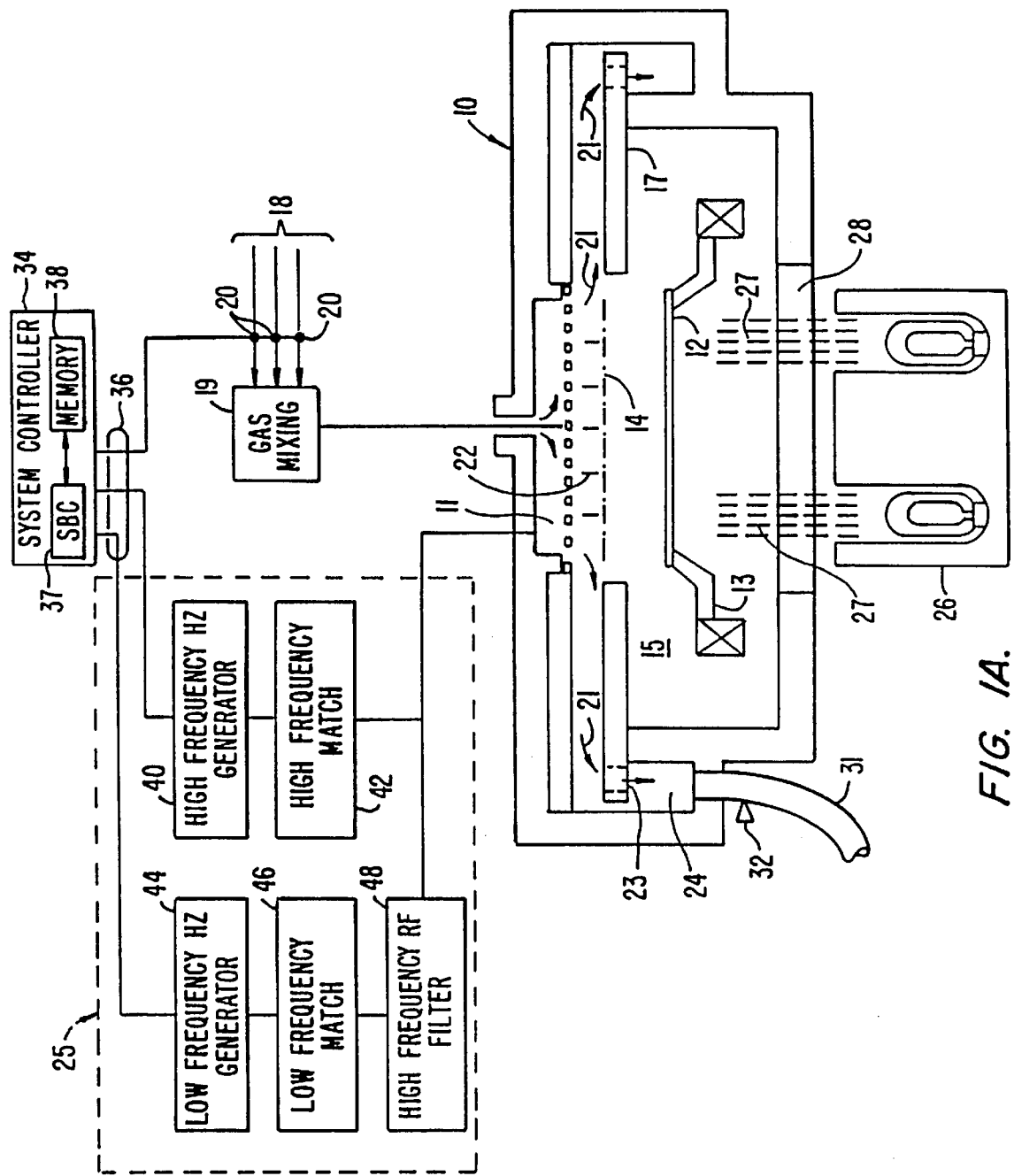
FIG. 1A is a vertical, cross-sectional view of one embodiment of a simplified chemical vapor deposition apparatus according to the present invention.

FIG. 1 illustrates one embodiment of a simplified, parallel-plate plasma enhanced chemical vapor deposition (PECVD) system 10 having a vacuum chamber 15 in which the dielectric layer according to the present invention can be deposited. CVD system 10 contains a gas distribution manifold 11 for dispersing process gases through perforated holes in manifold 11 to a wafer (not shown) that rests on a susceptor 12. Susceptor 12 is highly thermally responsive and is mounted on supports 13 so that susceptor 12 (and the wafer supported on the upper surface of susceptor 12) can be controllably moved between a lower loading/off-loading position and an upper processing position 14 which is closely adjacent to manifold 11. A center board (not shown) includes sensors for providing information on the position of the wafer.

When susceptor 12 and the wafer are in processing position 14, they are surrounded by a baffle plate 17 having a plurality of spaced holes 23 which exhaust into an annular vacuum manifold 24. Deposition and carrier gases are supplied through supply lines 18 into a mixing system 19 where they are combined and then sent to manifold 11. Generally, supply lines 18 for each of the process gases include (i) safety shut-off valves (not shown) that can be used to automatically or manually shut off the flow of process gas into the chamber, and (ii) mass flow controllers 20 that measure the flow of gas or liquid through the supply lines. When toxic gases are used in the process, the several safety shut-off valves are positioned on each gas supply line in conventional configurations. The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the wafer in a laminar flow as indicated by arrows 21 and 22. An exhaust system then exhausts the gas via ports 23 into the circular vacuum manifold 24 and out an exhaust line 31 by a vacuum pump system (not shown). The rate at which gases are released through exhaust line 31 is controlled by a throttle valve 32.

The deposition process performed in CVD system 10 can be either a thermal process or a plasma-enhanced process. This CVD system has the capability of performing, without hardware modification, both an SACVD process (20–700 torr) and a PECVD process (0.5–20 torr). The thermal process would typically be an SACVD process that uses ozone and TEOS in a temperature range of 350°–500° C. In a plasma process, a controlled plasma is formed adjacent to the wafer by RF energy applied to manifold 11 from RF power supply 25. Manifold 11 is also an RF electrode, while susceptor 12 is grounded. RF power supply 25 can supply either single or mixed frequency RF power (or other desired variation) to manifold 11 to enhance the decomposition of reactive species introduced into chamber 15. The mixed frequency RF power is generated by a high frequency RF generator 40 (RF1) and corresponding match circuit 42 and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of the susceptor and provides rapid thermal and uniform susceptor and wafer heating for effecting deposition.

Typically, any or all of the chamber lining, gas distribution manifold faceplate, supports 13, and various other reactor hardware is made out of material such as aluminum or anodized aluminum. An example of such a CVD apparatus is described in U.S. Pat. No. 5,000,113 previously mentioned and incorporated by reference.

A motor (not shown) raises and lowers susceptor 12 between a processing position 14 and a lower, wafer-loading position. Motors and optical sensors are used to move and determine the position of movable mechanical assemblies such as throttle valve 32 and susceptor 12. The heater, motors, valves or flow controllers 20 connected to supply lines 18, gas delivery system, throttle valve 32, RF power supply 25, and lamp magnet drivers are all controlled by a system controller 34 over control lines 36 of which only some are shown.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate processor 34.

In a preferred embodiment, the system controller includes a hard disk drive (memory 38), a floppy disk drive and a card rack. The card rack contains a single board computer (SBC) processor 37, analog and digital input/output boards, interface boards and stepper motor controller boards. Various parts of CVD system 10 conform to the Versa Modular Europeans (VME) standard which defines board, card cage, and connector dimensions and types. The VME standard also defines the bus structure having a 16-bit data bus and 24-bit address bus.

Figure 1B:
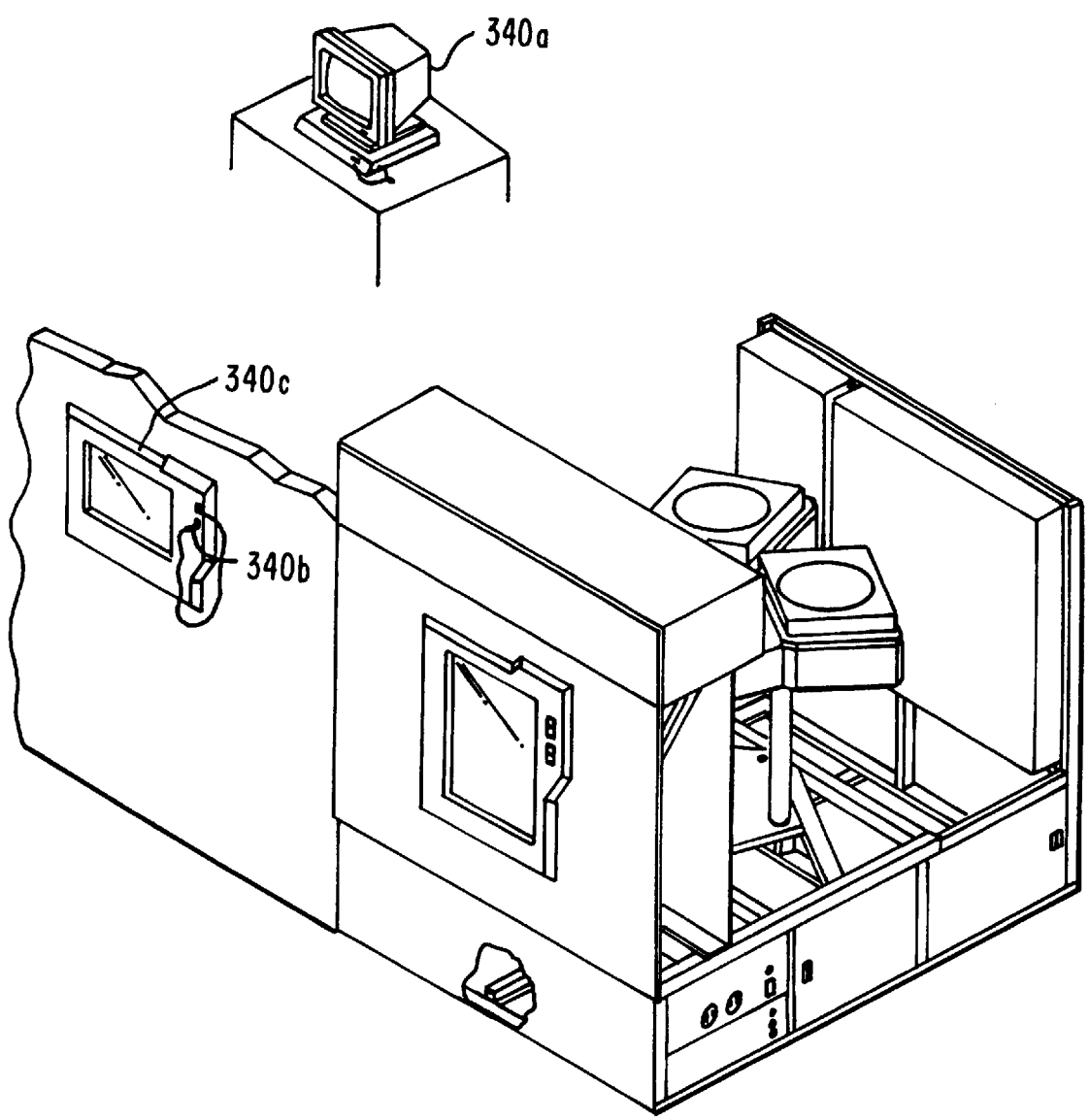
FIG. 1B is a simplified diagram of system monitor and CVD system 10 in a multi-chamber system, which may include one or more chambers.

The interface between a user and processor 34 is via a CRT monitor 50a and lightpen 50b, shown in FIG. 1B which is a simplified diagram of the system monitor and CVD system 10 in a multi-chamber system, which may include one or more chambers. In the preferred embodiment two monitors 50a are used, one mounted in the clean room wall for the operators and the other behind the wall for the service technicians. Both monitors 50a simultaneously display the same information, but only one lightpen 50b is enabled. The lightpen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the lightpen and the display screen. Of course, other devices, such as a keyboard, mouse, or other pointing or communication device, may be used instead of or in addition to lightpen 50b to allow the user to communicate with processor 34.

The process for depositing the film can be implemented using a computer program product that is executed by processor 34. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1C:
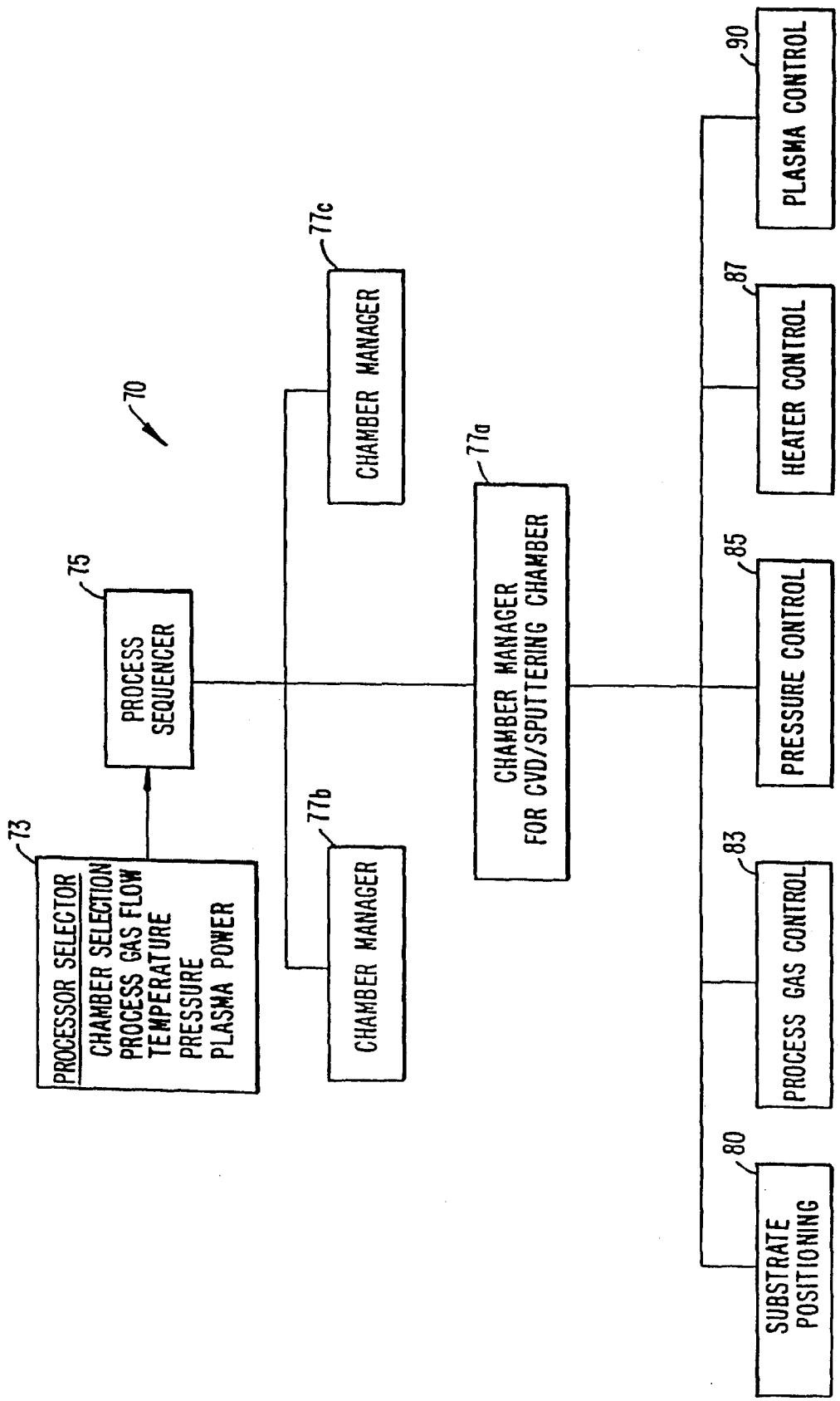
FIG. 1C shows an illustrative block diagram of the hierarchical control structure of the system control software, computer program 70, according to a specific embodiment.
Figure 2:
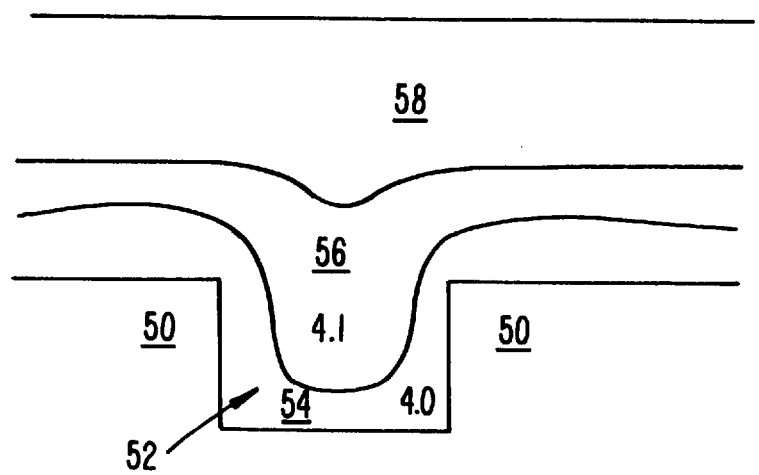
FIG. 2 is a cross-sectional view of a prior art gap-filling silicon oxide sandwich layer.

FIG. 1C shows an illustrative block diagram of the hierarchical control structure of the system control software, computer program 70, according to a specific embodiment. A user enters a process set number and process chamber number into a process selector subroutine 73 in response to menus or screens displayed on the CRT monitor by using the lightpen interface. The process sets are predetermined sets of process parameters necessary to carry out specified processes, and are identified by predefined set numbers. The process selector subroutine 73 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the lightpen/CRT monitor interface.

The signals for monitoring the process are provided by the analog input and digital input boards of the system controller and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 causes execution of the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 1C. The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines, and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example tetraethylorthosilane ("TEOS"), the process gas control subroutine 83 would be written to include steps for bubbling a delivery gas such as helium through the liquid precursor in a bubbler assembly or introducing a carrier gas such as helium to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system 115 of the chamber. The size of the opening of the throttle valve is set to control the chamber pressure to the desired level in relation to the total process gas flow, size of the process chamber, and pumping setpoint pressure for the exhaust system 115. When the pressure control subroutine 85 is invoked, the desired, or target, pressure level is received as a parameter from the chamber manager subroutine 77a. The pressure control subroutine 147 operates to measure the pressure in the chamber 15 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the temperature of the lamp module that is used to heat the substrate 20. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, compares the measured temperature to the setpoint temperature, and increases or decreases current applied to the lamp module 26 to obtain the setpoint temperature. The temperature is obtained from the measured voltage by looking up the corresponding temperature in a stored conversion table, or by calculating the temperature using a fourth order polynomial. When radiant lamps are used to heat the susceptor 12, the heater control subroutine 87 gradually controls a ramp up/down of current applied to the lamp. The gradual ramp up/down increases the life and reliability of the lamp. Additionally, a built-in fail-safe mode can be included to detect process safety compliance, and can shut down operation of the lamp module 26 if the process chamber 15 is not properly set up.

The plasma control subroutine 90 comprises program code for setting low and high frequency the RF power levels applied to the process electrodes in the chamber 15, and to set the low frequency RF frequency employed. Similar to the previously described chamber component subroutines, the plasma control subroutine 90 is invoked by the chamber manager subroutine 77a.

The above reactor description is mainly for illustrative purposes, and other plasma CVD equipment such as electron cyclotron resonance (ECR) plasma CVD devices, induction coupled RF high density plasma CVD devices, or the like may be employed. Additionally, variations of the above described system such as variations in susceptor design, heater design, RF power frequencies, location of RF power connections and others are possible. For example, the wafer could be supported and heated by a resistively heated platen. The layer and method for forming such a layer of the present invention is not limited to any specific apparatus or to any specific plasma excitation method.

II. The Sandwich Layer Film of the Present Invention

Figure 3:
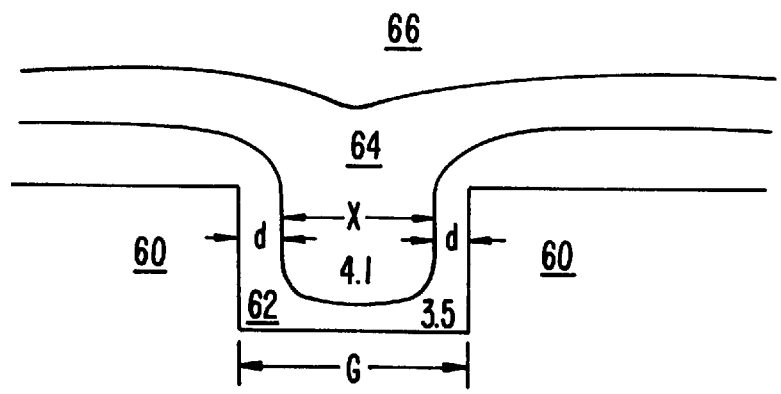
FIG. 3 is a cross-section of a silicon oxide sandwich layer according to one embodiment of the present invention.

FIG. 3 illustrates a silicon dioxide gap-filling sandwich layer according to one embodiment of the present invention. Metal lines 60 are first covered by a layer 62 formed in a PECVD process using TEOS in combination with ozone and a fluorine-containing compound, preferably $SiF_4$ or $C_2F_6$. These particular compounds are preferable because they produce less free fluorine, which can react with moisture in the subsequent SACVD film. An SACVD film 64 is formed to give the gap-fill characteristics desired using a nonplasma process with TEOS and ozone, with no dopants, to give a USG layer. This is subsequently followed by another PECVD layer 66 which can grow more rapidly and is used to provide the remaining thickness of the insulating layer. Layer 66 can be a fluorine doped silicon oxide film similar to layer 62, but is preferably a USG layer formed from a plasma of TEOS and oxygen.

The total capacitance across the gap width, G, as shown in FIG. 3, is a function of the thickness and area of the different layers and their corresponding dielectric constants. In particular, C=KεA/T where C is the capacitance, K=dielectric constant, ε=permitivity, A=area, and T=thickness (note that this equation does not take into account second-order effects, such as fringing fields). By choosing the appropriate thickness of the layer (determined by the process time and gas flows) one can achieve the desired dielectric constant and still maintain a sufficiently thick first layer to provide the desired compressive characteristic.

First layer 62 provides a barrier layer with a dielectric constant of less than 4.0, preferably approximately 3.5. Subsequently, an SACVD process is used with TEOS to form a gap-filling layer as previously described. Second layer 64 has a dielectric constant greater than 4.0, preferably approximately 4.1. By appropriately choosing the thickness of the respective layers, one can adjust the dielectric constant to a value which is a combination of the dielectric constants of the two different layers, resulting in a dielectric constant across the gap of between 3.5 and 4.0, preferably between about 3.6 and 3.7.

In a preferred embodiment, where the gap size G=0.3 micrometer, the thickness of the first layer 62 is D=700 Å, given a total thickness of 1400 Å for the two layers on the two walls of the gap. The remaining thickness across the 3000 Å gap of the SACVD layer 64 is preferably X=1600 Å. This combination will produce a dielectric constant of approximately K=3.7.

An exemplary recipe for producing first layer 62 of FIG. 3 according to one embodiment of the present invention is as follows:

| | |
|---|---|
| $O_2$ | 700 sccm |
| He | 700 sccm |
| TEOS | 915 mgm |
| $SiF_4$ | 725 sccm |
| Pressure | 5 torr |
| Spacing | 250 mils |
| Temperature | 400° C. |
| High Frequency RF | 13.56 MHz @ 110 W |
| Low Frequency RF | 350 KHZ @ 340 W |

This process gives a deposition rate of approximately 5000 Å/min. It is understood that the above gas introduction rates are based on a lamp-heated DCVD chamber manufactured by Applied Materials. The actual rates at which gases are introduced in other embodiments will vary if chambers of different volume and/or design are employed.

The present invention is particularly effective for filling in small geometry gaps having a high aspect ratio (e.g., an aspect ratio of between 1.5:1 up to approximately 2:1 or more). The invention may also be used to fill in gaps of other aspect ratios though.

As will be understood by those of skill in the art, the present invention may be embodied in other specific forms without departing from the spirit or essential characteristics thereof. Accordingly, the above description is intended to be illustrative, but not limiting, of the scope of the invention which is set forth in the following claims.

What is claimed is:

1. A method for forming a composite dielectric layer with a selected composite dielectric constant on a semiconductor substrate having conductive lines defining a narrow gap, the method comprising the steps of:

forming a first layer on the substrate and over the conductive lines using a plasma-enhanced chemical vapor deposition (PECVD) process combining reactants including TEOS, oxygen and a fluorine-containing compound, said first layer characterized by a first dielectric constant of less than about 4.0 and a first selected thickness sufficient to create compressive stress in said first layer and to partially fill the narrow gap between the conductive lines; and forming a second layer over said first layer using a non-plasma-enhanced, subatmospheric chemical vapor deposition (SACVD) process combining reactants including TEOS and one of oxygen and ozone, said second layer characterized by a second dielectric constant of about 4.0 or greater and a second thickness, wherein said first selected thickness is less than said second thickness and said first selected thickness and said second thickness are sufficient to produce a composite layer with the selected dielectric constant, said composite layer filling the gap between the conductive lines.

2. The method of claim 1 further comprising the step of forming said first layer with a dielectric constant of approximately 3.5.

3. The method of claim 1 further comprising the step of forming said layers over gaps in said semiconductor substrate having an aspect ratio of between about 1.5:1 to 2:1.

4. The method of claim 1 further comprising the step of depositing said layers for amounts of time required to produce relative thicknesses of said first and second layers in a gap in said semiconductor substrate such that an overall dielectric constant across said gap is between about 3.5 and 4.0.

5. The method of claim 4 wherein said fluorine-containing compound is selected from the group consisting of $SiF_4$ and $C_2F_6$.

6. The method of claim 1 further comprising the step of depositing said layers for amounts of time required to produce relative thicknesses of said first and second layers in a gap in said semiconductor substrate such that an overall dielectric constant across said gap is between approximately 3.6 and 3.7.

7. The method of claim 1 further comprising the step of forming said first layer to a thickness of approximately 700 angstroms, such that a combined thickness in a gap having such first layer on each wall of said gap is approximately 1400 angstroms.

8. The method of claim 7 further comprising the step of forming said second layer to a thickness of approximately 1600 angstroms in a gap of approximately 3000 angstroms.

* * * * *